United States Patent [19]
Nishio et al.

[11] Patent Number: 5,786,606
[45] Date of Patent: Jul. 28, 1998

[54] SEMICONDUCTOR LIGHT-EMITTING DEVICE

[75] Inventors: Johji Nishio; Hidetoshi Fujimoto, both of Kawasaki; Kazuhiko Itaya, Yokohama, all of Japan

[73] Assignee: Kabushiki Kaisha Toshiba, Kawasaki, Japan

[21] Appl. No.: 766,456

[22] Filed: Dec. 12, 1996

[30] Foreign Application Priority Data

Dec. 15, 1995 [JP] Japan ................. 7-327125
Mar. 8, 1996 [JP] Japan ................. 8-051141

[51] Int. Cl.$^6$ ............... H01L 33/00; H01L 31/0312
[52] U.S. Cl. ............................. 257/103; 257/77
[58] Field of Search ............................. 257/103, 77

[56] References Cited

U.S. PATENT DOCUMENTS

| | | |
|---|---|---|
| 3,960,619 | 6/1976 | Seiter ............................. 257/77 |
| 4,990,994 | 2/1991 | Furakawa et al. .................. 257/77 |
| 5,247,533 | 9/1993 | Okazaki et al. . | |
| 5,273,933 | 12/1993 | Hatano et al. . | |
| 5,408,120 | 4/1995 | Manabe et al. .................. 257/103 |
| 5,432,808 | 7/1995 | Hatano et al. . | |
| 5,523,589 | 6/1996 | Edmond et al. ................ 257/103 |

OTHER PUBLICATIONS

Fernando Guarin, et al. "SOI Wafers for Crystalline SiC and GaN Growth", Extended Abstracts, vol. 95–1, Spring Meeting, (pp. 631–632), Reno, NV, May 1995.

*Primary Examiner*—Stephen Meier
*Attorney, Agent, or Firm*—Oblon, Spivak, McClelland, Maier & Neustadt, P.C.

[57] ABSTRACT

Disclosed is a semiconductor light-emitting device, comprising a substrate, a thin film formed on the substrate and containing silicon carbide as a main component, a buffer layer formed on the thin film and consisting of a gallium nitride-based material, and a laminate structure formed on the buffer layer and consisting of a plurality of gallium nitride-based material layers, wherein the total thickness of the substrate and the thin film is at least twice the thickness of the buffer layer and is smaller than the thickness of the laminate structure.

10 Claims, 10 Drawing Sheets

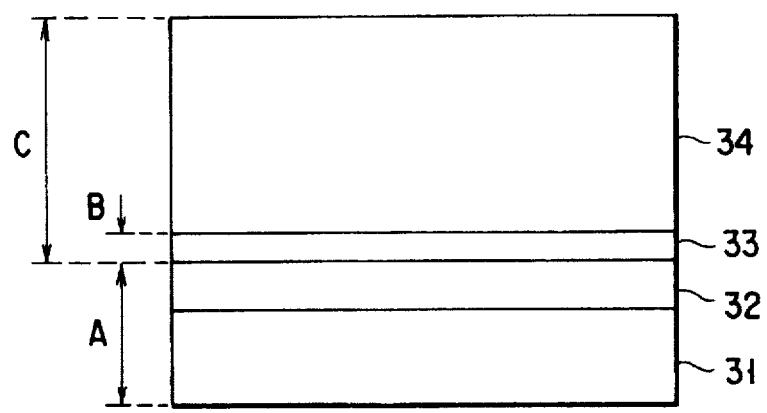
F I G. 3
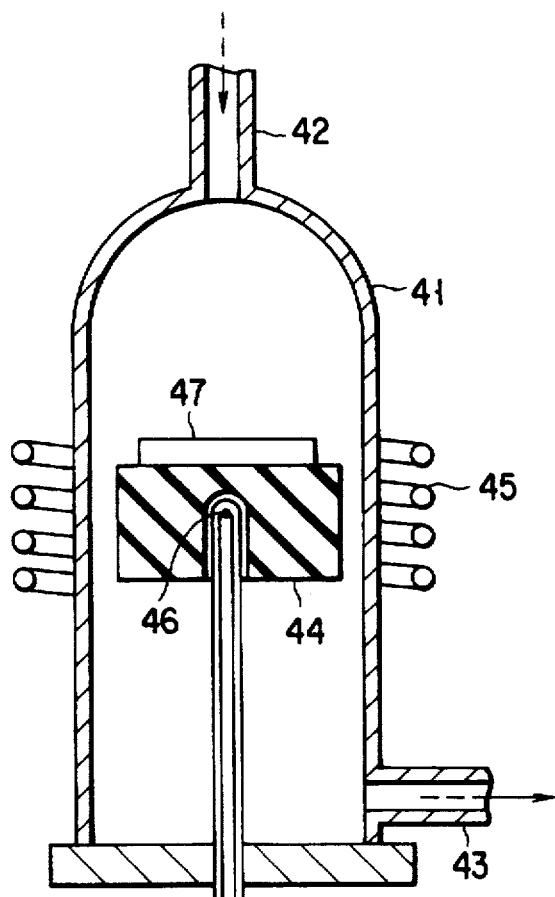
F I G. 4

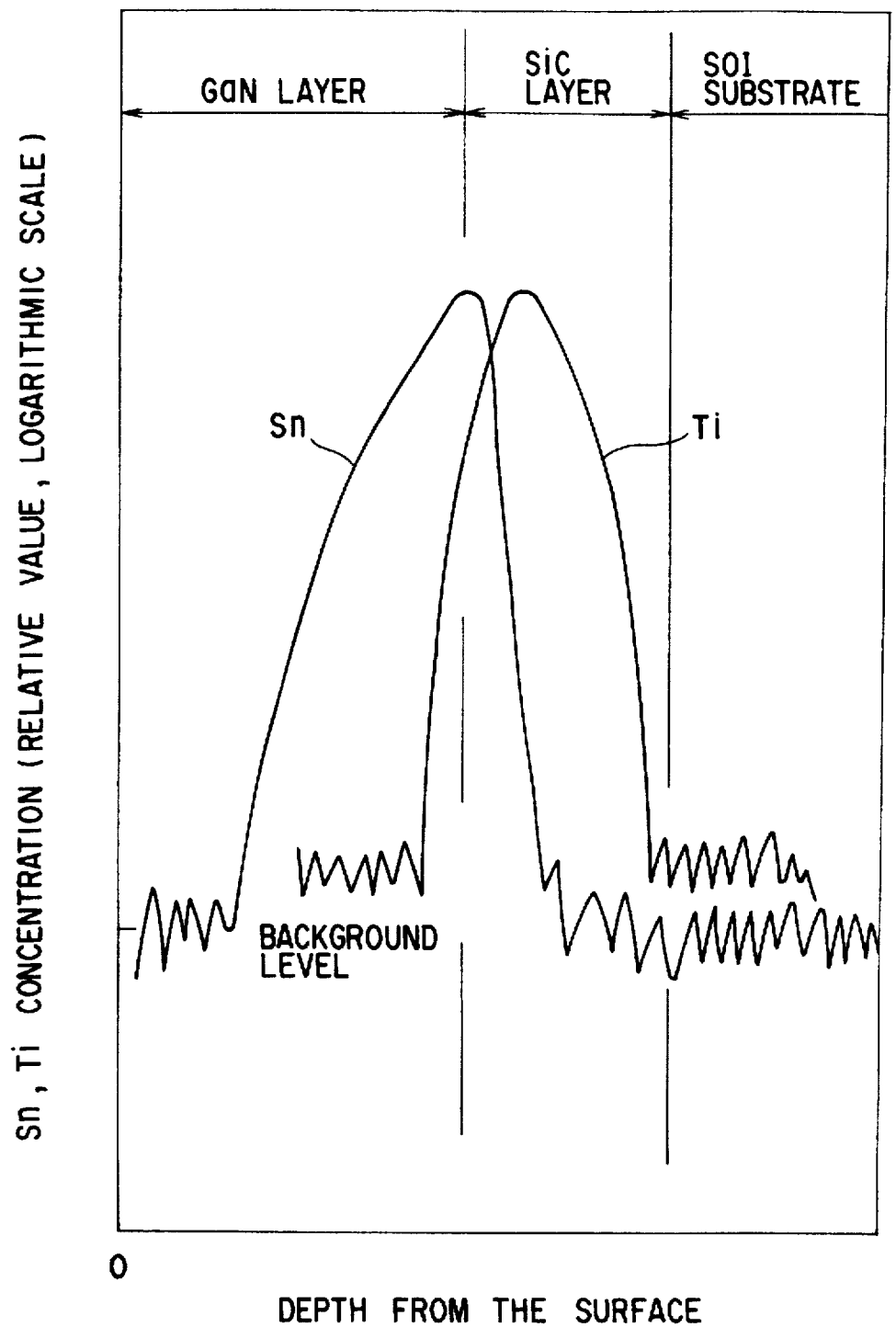
F I G. 10

SEMICONDUCTOR LIGHT-EMITTING DEVICE

BACKGROUND OF THE INVENTION

The present invention relates to a semiconductor light-emitting device using a gallium nitride-based material, particularly, to a semiconductor light-emitting device which permits alleviating the strain generated between a substrate and a semiconductor laminate structure constituting a device.

Gallium nitride, which is one of the III–V group semiconductors containing nitrogen, attracts attentions as a material of a device which emits light of a short wavelength, because the compound semiconductor (gallium nitride) has such a large band gap as 3.4 eV and is of a direct transition type. Further, a gallium nitride-based material, which is prepared by, for example, alloying of indium nitride attracts attentions as a material of a light-emitting device which emits lights of a wide range including orange light and ultraviolet light because the band gap of the gallium nitride-based material can be controlled over a wide range.

As a substrate of a light-emitting device, required is a material which is stable at high temperatures employed for the growth of the gallium nitride-based material and which is small in difference in lattice constant from the gallium nitride-based material. An metal-organic chemical vapor deposition method (MOCVD method) permits obtaining a deposited film having a relatively good surface condition. Also, a sapphire wafer, of which availability is good, having a diameter of about 2 inches, is widely used as a substrate for forming a device thereon. In the case of using a sapphire substrate, however, a gallium nitride layer tends to grow in an island shape because the lattice mismatching between sapphire and gallium nitride is as high as about 16%. Also, the dislocation density within the thin film of the grown gallium nitride layer is as high as about $10^{12} cm^{-2}$, leading to a low light-emitting efficiency, a high operating voltage, and an insufficient yield.

When it comes to, for example, a gallium nitride-based semiconductor light-emitting device formed on a sapphire substrate and emitting light having a wavelength of 520 nm, the light-emitting efficiency under a current of 20 mA is 6% in terms of the external quantum efficiency. Also, the operating voltage of the light-emitting device is 3.5%. Further, in terms of the life of the light-emitting device, the occurrence of defective devices is 25% over the operation for 1,000 hours under a current of 40 mA. Naturally, it is desirable to improve further the light-emitting efficiency, to lower further the operating voltage, and to prolong further the life of the device.

On the other hand, a hexagonal lattice silicon carbide having a lattice mismatching smaller than that of sapphire also attracts attentions as a substrate material. However, it is difficult to obtain a large silicon carbide substrate because of the polymorphism generation which is unavoidably inherent in silicon carbide. Silicon carbide is also poor in its workability, making it difficult to obtain a silicon carbide substrate having a surface of sufficient flatness and cleanness. Further, silicon carbide has a lattice mismatching markedly larger than that of a light-emitting element such as a gallium arsenide-based element or a gallium phosphide-based element, though the mismatching of silicon carbide is certainly smaller than that of sapphire. Under the circumstances, extensive researches are being made on various other materials for use as a substrate of a gallium nitride-based material layer.

However, these prospective substrate materials are chemically unstable at the growing temperature of the gallium nitride-based material layer, even if these substrate materials are small in their lattice mismatching. Therefore, it is impossible to put these substrate materials to practical use in most cases.

As described above, strain is left unremoved in the gallium nitride-based semiconductor laminate structure portion, when it comes to the conventional gallium nitride-based semiconductor light-emitting device involving a large lattice mismatching. The residual strain causes serious problems during the heat treatment applied in the subsequent step of forming a semiconductor device region. For example, the added impurity is abnormally diffused during the heat treatment, leading to a low light-emitting efficiency, a high operating voltage, and a short life.

BRIEF SUMMARY OF THE INVENTION

An object of the present invention is to provide a semiconductor light-emitting device which exhibits a high light-emitting efficiency, can be operated with a low operating voltage, and also exhibits a long life.

According to a first embodiment of the present invention, there is provided a semiconductor light-emitting device, comprising a substrate, a thin film formed on the substrate and containing silicon carbide as a main component, a buffer layer formed on the thin film and consisting of a gallium nitride-based material, and a laminate structure formed on the buffer layer and consisting of a plurality of gallium nitride-based material layers, wherein the total thickness of the substrate and the thin film is at least twice the thickness of the buffer layer and is smaller than the thickness of the laminate structure.

According to a second embodiment of the present invention, there is provided a semiconductor light-emitting device, comprising a thin film containing silicon carbide as a main component, a buffer layer formed on the thin film and consisting of a gallium nitride-based material, and a laminate structure formed on the buffer layer and consisting of a plurality of gallium nitride-based material layers, wherein the thickness of the thin film is at least twice the thickness of the buffer layer and is smaller than the thickness of the laminate structure.

Further, according to a third embodiment of the present invention, there is provided a light-emitting diode, comprising a substrate, a thin film formed on the substrate and containing silicon carbide as a main component, a buffer layer formed on the thin film and consisting of a gallium nitride-based material, and a laminate structure formed on the buffer layer and consisting of a plurality of gallium nitride-based material layers, wherein the total thickness of the substrate and the thin film is at least twice the thickness of the buffer layer and is smaller than the thickness of the laminate structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 shows how the thicknesses A, B and C are defined;

FIG. 4 schematically shows the construction of an metal-organic chemical vapor deposition (MOCVD) apparatus used in Example 1 of the present invention;

FIG. 10 is a graph showing the distribution of the tin and titanium concentrations in the depth direction of the light-emitting diode according to the fourth embodiment of the present invention;

DETAILED DESCRIPTION OF THE INVENTION

Figure 1:
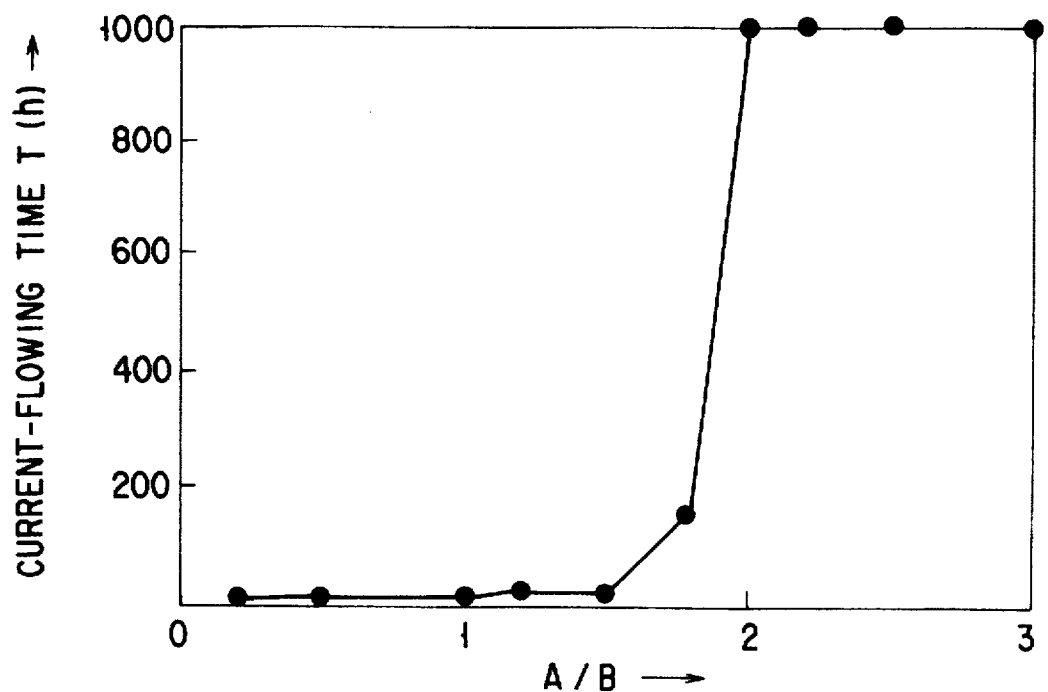
FIG. 1 is a graph showing changes in the current-flowing time relative to a thickness ratio A/B.

A semiconductor light-emitting device according to the present invention comprises a laminate structure consisting of a plurality of gallium nitride-based material layers, and is featured in that a thin film containing silicon carbide as a main component is formed between a substrate and a buffer layer or below a buffer layer where the device does not comprise the substrate. In the present invention, the total thickness of the substrate and the thin film should be at least twice, preferably 10 to 200 times as thick as, the thickness of the buffer layer, and should be smaller than the thickness of the laminate structure.

Where the total thickness of the substrate and the thin film is less than twice the thickness of the buffer layer, the life of the semiconductor light-emitting device is very short, failing to withstand the practical use of the device. The life of the semiconductor light-emitting device is also short, where the total thickness of the substrate and the thin film exceeds the thickness of the laminate structure of the gallium nitride-based material layers.

Where the light-emitting device does not include the substrate, the thickness of the silicon carbide-based thin film should be at least twice, preferably 10 to 200 times as thick as, the thickness of the buffer layer, and should be smaller than the thickness of the laminate structure. Preferably, the thickness of the silicon carbide-based thin film should fall within a range of between 200 nm and 8 μm.

A IV group element can be added to the thin film. The addition of the IV group element permits diminishing the lattice mismatching between the silicon carbide-based thin film and the buffer layer and also permits lowering the dislocation density. At least one element selected from Ge, Sn and Ti can be used as the IV group element. Preferably, the concentration of the IV group element within the silicon carbide-based thin film should fall within a range of between $10^{19}$ cm$^{-3}$ and $10^{22}$ cm$^{-3}$.

The IV group element within the silicon carbide-based thin film should desirably be distributed such that the concentration of the IV group element is increased toward the buffer layer. The particular distribution of the IV group element concentration permits the lattice constant to be moderately changed between the silicon carbide-based thin film and the buffer layer, making it possible to avoid the stress concentration on the interface between the thin film and the buffer layer.

At least the surface region of the substrate used in the present invention may be formed of silicon. It is desirable for the planar orientation of the silicon surface layer to be substantially (111).

The technical idea of the present invention can be applied to a light-emitting diode and a semiconductor laser. Particularly, the present invention produces a prominent effect when the particular technical idea is applied to a light-emitting diode.

In the manufacture of a semiconductor light-emitting element of the present invention, it is possible to use as a substrate a SIMOX (Separation by Implantation of Oxygen) substrate, a substrate having a nitride film-separating layer formed by a nitrogen ion implantation into a surface region of a silicon substrate, or an SOI (Silicon On Insulator) substrate having a silicon layer formed on a silicon substrate with an insulating film interposed therebetween.

In the case of using a SIMOX substrate, the laminate structure portion consisting of gallium nitride-based material layers can be separated from the SIMOX substrate by etching an oxide separation layer. Also, in the case of using an SOI substrate, the laminate structure portion can be separated from the underneath substrate of the SOI by etching an insulating film.

The buffer layer included in the light-emitting device of the present invention should be formed of GaN or AlGaN. Further, the MOCVD method should desirably be employed for forming the silicon carbide-based thin film and the laminate structure portion consisting of gallium nitride-based material layers.

In the semiconductor light-emitting device of the present invention constructed as already described, a gallium nitride-based material layer is formed by MOCVD method on the surface of a substrate having at least the uppermost layer consisting of silicon and having a planar orientation of substantially (111). Then, the surface of substrate is carbonized to form a silicon carbide-based surface layer. Alternatively, a silicon carbide-based layer is grown by MOCVD method on the surface of the substrate. As a result, growth resulting from non-uniform nucleus formation takes place in the substrate of the silicon carbide-based layer. It follows that the substrate material is converted into hexagonal silicon carbide. What should be noted is that the use of a substrate having a silicon carbide-based layer formed on the surface permits performing a crystal growth with a lattice mismatching made markedly smaller, compared with the use of a sapphire substrate.

Then, a laminate structure consisting of a plurality of gallium nitride-based layers are formed on the substrate, followed by removing completely or partially the substrate. As a result, it is possible to alleviate the lattice strain received by the laminate structure portion consisting of the gallium nitride-based material layers under the influence given by the substrate including the silicon carbide-based surface layer.

To be more specific, the strain is received by the silicon carbide-based layer formed on the substrate surface, which is thinner than the laminate structure portion consisting of a plurality of gallium nitride-based material layers. Further, a gallium nitride-based thin film layer (buffer layer) is formed between the silicon carbide surface layer and the laminate structure portion in the present invention. It should be noted that the thickness of the buffer layer should be at most half the total thickness of the substrate and the silicon carbide-based layer formed on the substrate surface. Where the substrate is completely removed, the thickness of the buffer layer should be at most half the thickness of silicon carbide-based surface layer. The presence of the buffer layer completely prevents the laminate structure portion consisting of a plurality of gallium nitride-based material layers from receiving the strain during the heat treatment in the subsequent process of forming an element region, i.e., the strain derived from the lattice mismatching with or the difference in the thermal expansion coefficient from the substrate.

Figure 2:
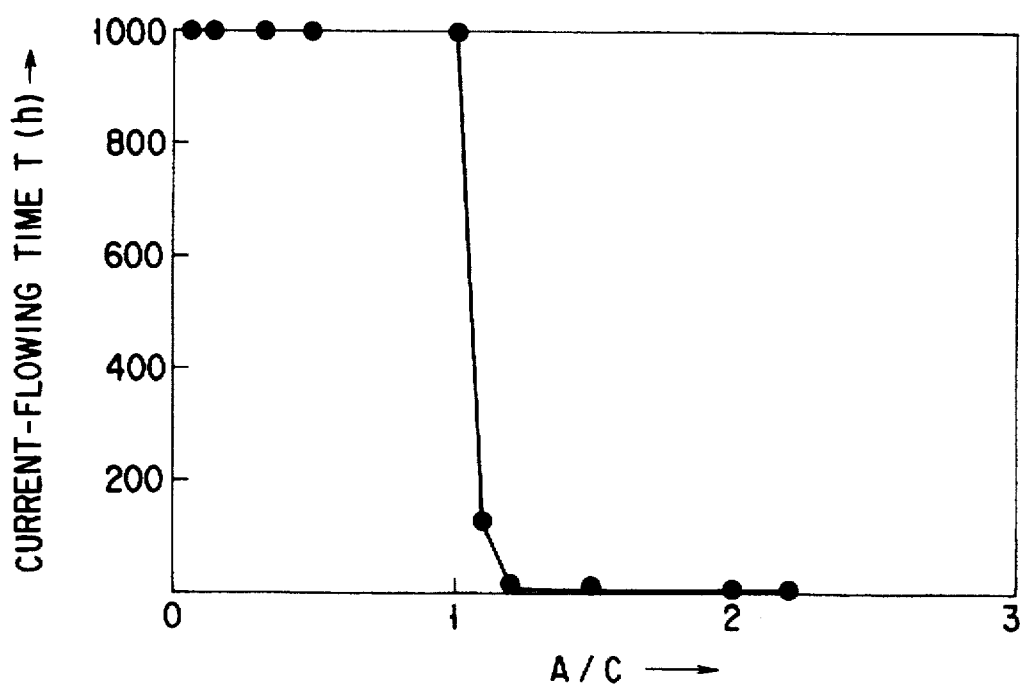
FIG. 2 is a graph showing changes in the current-flowing time relative to a thickness ratio A/C.

FIGS. 1 and 2 show the particular mechanism which has been experimentally confirmed. The definitions of the parameters shown in FIGS. 1 and 2 are as shown in FIG. 3. Specifically, the values of A/B, in which A denotes the total thickness of a substrate 31 and a silicon carbide thin film layer 32 as shown in FIG. 3, with B representing the thickness of a silicon nitride-based thin film layer (buffer layer) 33, are plotted on the abscissa of FIG. 1. On the other hand, the values of A/C, in which A is as defined above, with B representing the thickness of a laminate structure portion 34, as shown in FIG. 3, consisting of a plurality of gallium nitride-based material layers, are plotted on the abscissa of FIG. 2. Further, the current-flowing time T at which the electroluminescence intensity becomes half the initial value is plotted in the ordinate in each of FIGS. 1 and 2.

FIG. 1 is a graph showing the initial light-emitting characteristics of the semiconductor light-emitting device of the construction described above. Specifically, given in the graph of FIG. 1 are experimental data, which show the current-flowing time T at which the electroluminescence intensity becomes half the initial value relative to the values of A/B, i.e., the value obtained by dividing the total thickness A of the silicon carbide thin film layer 32 and the substrate 31 by the thickness B of the adjacent gallium nitride-based material layer (buffer layer), as already described. The experiment was conducted under a current of 40 mA, which is twice the ordinary value. Temperature was set at 50° C. Further, the thickness B of the buffer layer 33 was fixed at 20 nm.

FIG. 1 shows that the time T is 1,000 hours in all the cases where the thickness ratio A/B is 2 or more. This is because a durability test for 1,000 hours was conducted in this experiment. In other words, the electroluminescence intensity was not lowered to half the initial value in all the cases where the thickness ratio A/B was 2 or more. On the other hand, the light-emitting device was found to be deteriorated very rapidly in the case where the thickness ratio A/B was less than 2.

FIG. 2 shows experimental data similar to those shown in FIG. 1, except that the thickness ratio A/C, in which C denotes the thickness of the laminate structure portion 34 consisting of gallium nitride-based material layers, was changed in various fashions, with the thickness ratio A/B kept at 2. In this experiment, the thickness C of the laminate structure portion 34 was fixed at 2 μm.

The experimental data shown in FIG. 2 clearly support that it is necessary for the total thickness A of the silicon carbide thin film layer 32 and the substrate 31 to be smaller than the thickness C of the laminate structure portion 34 of the gallium nitride-based material layers. The samples showing poor experimental data were examined in order to look into the reasons for the severe initial deterioration of the light-emitting characteristics. It is considered reasonable to understand that, in the conventional manufacturing method, the gallium nitride-based material layer, while receiving strain derived from a lattice mismatching or a difference in thermal expansion coefficient from the substrate, is subjected to a heat treatment, giving rise to proliferation of dislocations or occurrence of fine cracks which cannot be detected by naked eyes so as to deteriorate the light-emitting characteristics of the device. It is also considered reasonable to understand that a semiconductor light-emitting device of a long life cannot be manufactured by the conventional method, leading to the poor light-emitting characteristics of the device.

In the light-emitting device of the present invention, however, a lattice mismatching can be diminished by using a silicon carbide-based thin film layer. In addition, the strain applied to the laminate structure portion can be alleviated in the device manufacturing process by determining appropriately the thickness ratios A/B and A/C. As a result, it is possible to suppress deterioration in the life of the semiconductor light-emitting device.

Suppose an aluminum nitride buffer layer is grown at about 500° C. in a thickness of about 50 nm on a sapphire substrate. In general, it was substantially impossible for the dislocation density of gallium nitride layer grown on the buffer layer noted above not to be lower than $10^8/cm^2$. Incidentally, the dislocation density was obtained by measuring the density of etch pits formed by treatment of the gallium nitride layer with a hot phosphoric acid.

On the other hand, where a hexagonal lattice (0001) silicon carbide buffer layer is formed on a (111) silicon substrate by selecting appropriately a flow rate ratio of silane to acetylene, it is possible to lower the dislocation density, measured as above, of the gallium nitride layer grown on the particular buffer layer to about $10^6/cm^2$.

The present inventors have continued an extensive research in an attempt to diminish the lattice mismatching and, thus, to lower the dislocation density, finding that it is effective to dope in advance silicon carbide having a crystal structure of hexagonal system with IV group elements having an atomic number larger than that of silicon, e.g., Ge, Sn and Ti.

To be more specific, if an element of a substitution type, which permits forming a solid solution without changing the crystal system and also permits enlarging the lattice constant, is added at the position of the carbon atom or silicon atom of the silicon carbide buffer layer, it is possible to diminish the lattice mismatching with the gallium nitride-based material layer grown on the buffer layer. As one ideal pattern, a no-strain state is achieved at the interface between the buffer layer and the gallium nitride-based material layer during growth of the gallium nitride-based material layer by selecting and controlling appropriately the amount and distribution of the element added to the buffer layer such that at least the uppermost surface region of the buffer layer has a lattice constant equal to that of the gallium nitride-based material layer growing immediately above the buffer layer at the growing temperature of the gallium nitride-based material layer.

The semiconductor wafer used in the present invention permits achieving the above-noted idea and is markedly effective for lowering the dislocation density. In fact, the dislocation density can be lowered to about $5 \times 10^3/cm^2$. This suggests that it is necessary to match the lattice constant at the growing temperature, and that the strain derived from the difference in the thermal expansion coefficient in the cooling step after the growth to room temperature can be lowered to a negligible level by removing completely or partially the substrate.

EXAMPLE 1

FIG. 4 schematically shows the construction of an metal-organic chemical vapor deposition (MOCVD) apparatus used in this Example. As shown in the drawing, the MOCVD apparatus comprises a vapor growth vessel 41 made of quartz. A precursor gas is supplied from a gas inlet port 42 into the vapor growth vessel 41, and a waste gas is discharged from within the vapor growth vessel 41 through a gas discharge port 43. A susceptor 44 made of graphite, which is housed in the vapor growth vessel 41, is heated by a radio frequency heating device 45. Temperature of the susceptor 44 is measured and controlled by a thermocouple 46 made of W5% Re-W26% Re. It is seen that a substrate 47 is disposed directly on the susceptor 44 so as to be heated.

Figure 5A:
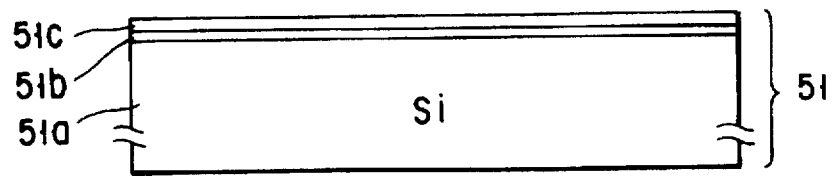
FIGS. 5A to 5C are cross sectional views collectively showing the process of manufacturing a light-emitting diode according to a first embodiment of the present invention.
Figure 5B:
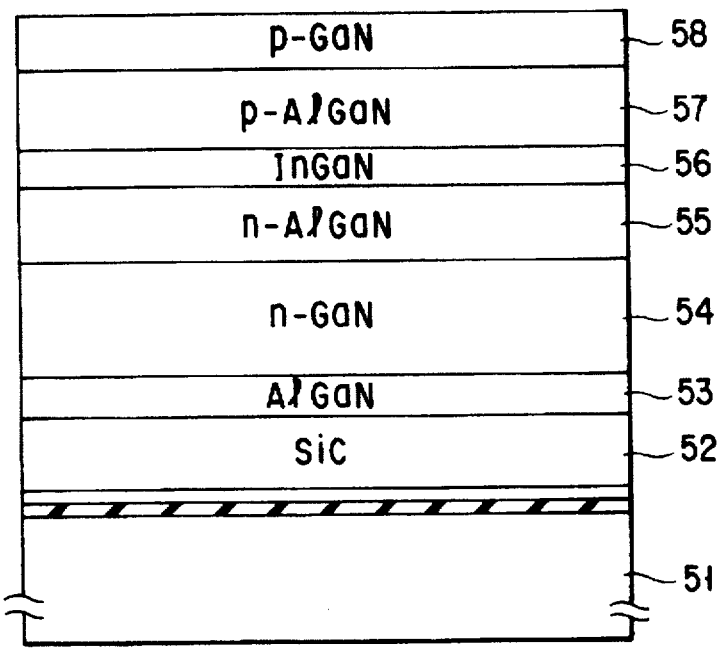
Figure 5C:
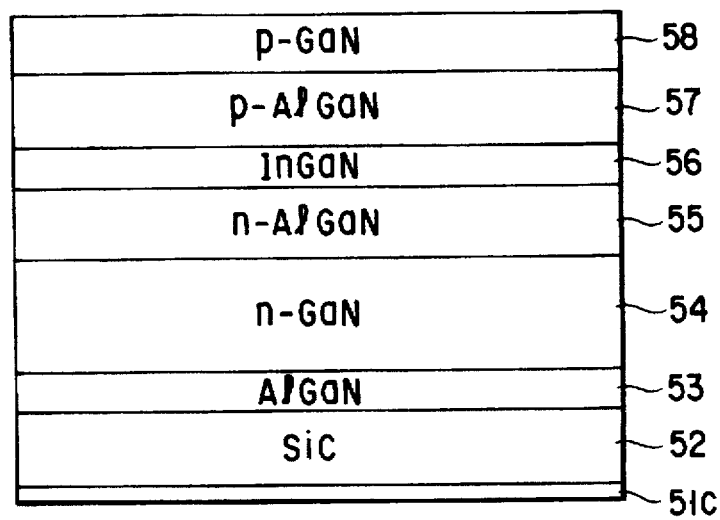

A light-emitting diode was prepared by using the MOCVD apparatus constructed as shown in FIG. 4. FIGS. 5A to 5C are cross sectional views showing the steps of preparing the light-emitting diode.

Before the crystal growth, oxygen ions were implanted at a dose of $4 \times 10^{17}$ atoms/cm$^2$ into an n-type (111) silicon single crystal wafer having a diameter of 4 inches. The ion implantation was performed under an accelerating energy of 180 keV and a beam current of 70 mA. The substrate temperature was maintained at 550° C. during the ion implantation step. The wafer after the ion implantation step was subjected to a heat treatment at 1350° C. for 3 hours under a mixed gas atmosphere consisting of an argon gas and an oxygen gas so as to form a homogeneous buried oxide layer 51b having a thickness of 82 nm below an uppermost silicon single crystal layer 51c having a thickness of about 330 nm. The resultant SIMOX wafer was used as a substrate 51, as shown in FIG. 5A.

Then, supply of an electric power to the radio frequency heating device 45 was started, while supplying a hydrogen gas into the vapor growth vessel 41 through the gas inlet port 42, so as to control the indication of the thermocouple 46 at 1400° C. The indication of the thermocouple 46 is hereinafter referred to simply as temperature. After the temperature control, supply of both acetylene gas and nitrogen into the vapor growth vessel 41 was started so as to carbonize the surface of the SIMOX substrate 51 and, thus, to form a nitrogen-added SiC layer 52 in a thickness of 300 nm. Then, the acetylene gas supply was stopped. At the same time, supply of an ammonia into the vapor growth vessel 41 was started, followed by lowering the temperature within the vapor growth vessel 41 to 600° C. When the temperature was stabilized at 600° C., trimethyl gallium (TMG) and trimethyl aluminum (TMA) were supplied into the vapor growth vessel 41 so as to perform an AlGaN layer growth for 5 minutes and, thus, to form an AlGaN layer (buffer layer) 53 having a thickness of 20 nm. After formation of the buffer layer 53, both TMG and TMA ceased to be supplied into the vapor growth vessel 41, followed by elevating again the temperature within the vapor growth vessel 41 to 1,200° C.

In the next step, supply of both a silane gas diluted with a hydrogen gas and a TMG gas into the vapor growth vessel 41 was started so as to achieve growth of a Si-added n-type GaN layer 54 for 30 minutes, followed by supplying an additional TMA so as to achieve growth of a Si-added n-type AlGaN layer 55 for 15 minutes. After TMG, TMA and silane ceased to be supplied, the temperature within the vapor growth vessel 41 was lowered to 900° C. When the temperature within the vapor growth vessel 41 was stabilized at 900° C., both TMG ad TMI were supplied into the vapor growth vessel 41 for achieving growth of an InGaN layer 56 for 5 minutes. After TMG and TMI ceased to be supplied, the temperature within the vapor growth vessel 41 was elevated again back to 1,200° C. When the temperature was stabilized at 1,200° C., TMG, TMA and biscyclopentadienyl magnesium (hereinafter referred to as Cp$_2$Mg) were supplied into the vapor growth vessel 41 so as to achieve growth of a Mg-added p-type AlGaN layer 57 for 15 minutes, followed by further achieving growth of a Mg-added p-type GaN layer 58 for 10 minutes by stopping the TMA supply, as shown in FIG. 5B.

After growth of the Mg-added p-type GaN layer 58, TMG and Cp$_2$Mg ceased to be supplied into the vapor growth vessel 41. Also, the power supply to the radio frequency heating device 45 was stopped. When the temperature within the vapor growth vessel 41 was lowered to 350° C., ammonia ceased to be supplied into the vapor growth vessel 41.

As described above, the resultant wafer included a laminate structure portion consisting of the gallium nitride-based material layers 53 to 58. The thickness of the laminate structure portion, which was measured by an electron microscope, was found to be 3.5 μm, which is thicker than the thickness (300 nm) of the SiC layer 52 formed on the silicon layer on the surface of the substrate 51. It has also been found that the thickness of the SiC layer 52 is more than twice the thickness (20 nm) of the buffer layer 53.

The resultant wafer was dipped in an aqueous solution of ammonium fluoride. Then, an ultrasonic vibration was imparted to the wafer so as to dissolve gradually the buried oxide (BOX) layer 51b of the SIMOX substrate. As a result, the underneath silicon single crystal layer was separated completely in about 2 hours from the laminate structure of the gallium nitride-based material layers, as shown in FIG. 5C. The laminate structure of the gallium nitride-base material layers was taken out carefully, followed by washing the laminate structure with a flowing water and subsequently drying the washed laminate structure. Then, a laminate structure of Ni/Cr/W layers was formed by using a sputtering apparatus on the back surface, i.e., the surface of the residual silicon single crystal layer 51c in contact with the SiC layer 52, of the laminate structure of the gallium nitride-based material layers.

A very thin oxide layer was left unremoved on the back surface of the laminate structure of the gallium nitride-based material layers. The amount of the residual oxide layer was considered to bring about no practical problem. In addition, a long time seemed to be required for completely removing the residual oxide layer. Therefore, the residual oxide layer was left unremoved. Then, a heat treatment was applied at 1,000° C. for 20 minutes so as to obtain ohmic electrode characteristics. Further, a Au—Zn alloy layer was formed by vapor deposition on the front surface of the laminate structure of the gallium nitride-based material layers, followed by applying a heat treatment to the alloy layer at 800° C. for 2 minutes so as to obtain ohmic electrode characteristics.

A cross section of the light-emitting diode thus prepared was observed with an electron microscope, with the result that cracks, which are observed in some cases in the conventional light-emitting diode, were not observed at all. Also, stripe-lice defects, which are observed on a bundle of dislocations in the conventional light-emitting diode, were not observed at all. Further, the optical properties of the resultant light-emitting diode were measured, with the result that the light-emitting efficiency of the diode was very high. Specifically, the peak of the wavelength of the light emitted from the light-emitting diode was 520 nm. Further, under the condition that current of 20 mA was conducted through the diode, the operating voltage of the diode was as low as 2.1V, and the external quantum efficiency was as high as 12.2%.

The light-emitting diode was subjected to a life test under a current of 40 mA. The defect occurrence after the test, which was continued for 1,000 hours, was found to be 1% or less, supporting that the present invention permits prolonging the life of the light-emitting diode.

A SIMOX substrate with a low dose of an impurity was used in Example 1 described above. Alternatively, it is possible to use a substrate available on the market, said substrate including a buried oxide layer having a thickness of 400 nm and an uppermost silicon layer having a thickness of 100 nm, with substantially the same result in terms of the produced effect. Also, in the step of preparing the SIMOX substrate in Example 1, the ion implantation step was followed by a heat treatment at 1350° C. for 3 hours under a mixed gas atmosphere consisting of an argon gas and an oxygen gas so as to convert the silicon on the uppermost surface region into a single crystal. However, the particular heat treatment can be omitted, with substantially the same result in respect of the produced effect.

However, since the life of the light-emitting diode was found to tend to be shortened to some extent, a measure was taken for suppressing the difficulty. Specifically, nitric acid and hydrofluoric acid were added in the step of dissolving the buried oxide layer. It has been found that, if silicon remaining in a very small amount is dissolved together with the oxide layer, the ohmic properties of the electrode are not impaired over a long period of time, leading to a long life of the light-emitting diode.

As described above, the SiC layer 52 is interposed between the SIMOX substrate 51 and the laminate structure portion consisting of the gallium nitride-based material layers 52 to 58 in Example 1, making it possible to achieve the crystal growth for forming the laminate structure portion under the condition that the lattice mismatching is made markedly small. Further, the oxide layer 51b included in the SIMOX substrate 51 is removed later in Example 1, making it possible to alleviate the lattice strain received by the gallium nitride-based material layers under the influence given by the underneath substrate, though the lattice strain in question is not prominent. It follows that it is possible to permit the gallium nitride-based material layers to be completely free from the strain generated by the lattice mismatching with the substrate or by the difference in thermal expansion coefficient from the substrate during the heat treatment in the subsequent process of forming the light-emitting diode. As a result, proliferation of dislocations and occurrence of fine cracks which cannot be detected by naked eyes can be prevented, making it possible to obtain a light-emitting diode of a long life, which exhibits a high light-emitting efficiency and can be operated under a low operating voltage.

As a modification of Example 1, nitrogen ions were implanted at a dose of $4 \times 10^{17}$ atoms/cm$^2$ into an n-type (111) silicon single crystal wafer having a diameter of 4 inches. The ion implantation was performed under an accelerating energy of 180 keV and a beam current of 70 mA, as in the oxygen ion implantation in Example 1. During the nitrogen ion implantation, the substrate temperature was kept at 550° C. After the nitrogen ion implantation, the wafer was subjected to a heat treatment for 3 hours at 1,400° C. under a mixed gas atmosphere consisting of an argon gas and an oxygen gas. As a result, formed was a homogeneous buried nitride layer 51b having a thickness of 96 nm below the uppermost silicon single crystal layer 51c having a thickness of about 350 nm, thereby to obtain a substrate 51 including an underneath silicon substrate 51a together with the layers 51b and 51c noted above, as shown in FIG. 5A.

The subsequent steps were exactly the same as those of Example 1, thereby to obtain exactly the same result. The sole difference between Example 1 and the modification described above was that nitrogen ions were implanted into the wafer in the modification in place of oxygen ions implanted in Example 1. In Example 1, the oxide layer 51b was chemically removed. However, since it is difficult to chemically remove the nitride layer 51b, a solution consisting of the same amount of hydrofluoric acid and nitric acid was used in the modification for dissolving the silicon layer 51c. What should be noted is that, since it is important to leave the silicon layer 51c unremoved in the step of removing the substrate, attentions should be paid not to carry out the treatment for carbonizing the surface region for an unduly long time.

EXAMPLE 2

A substrate differing from that used in Example 1 was used in this Example.

Figure 6A:
FIGS. 6A to 6C are cross sectional views collectively showing the process of manufacturing a light-emitting diode according to a second embodiment of the present invention.
Figure 6B:
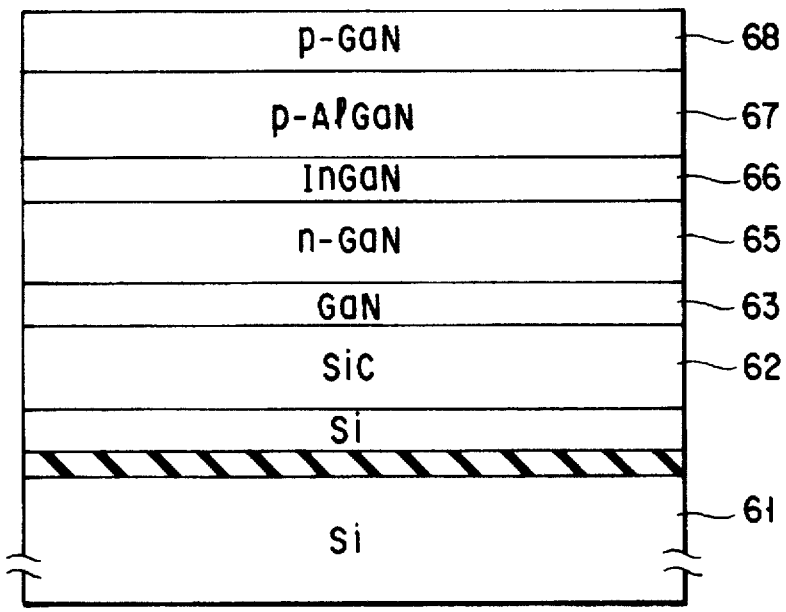
Figure 6C:
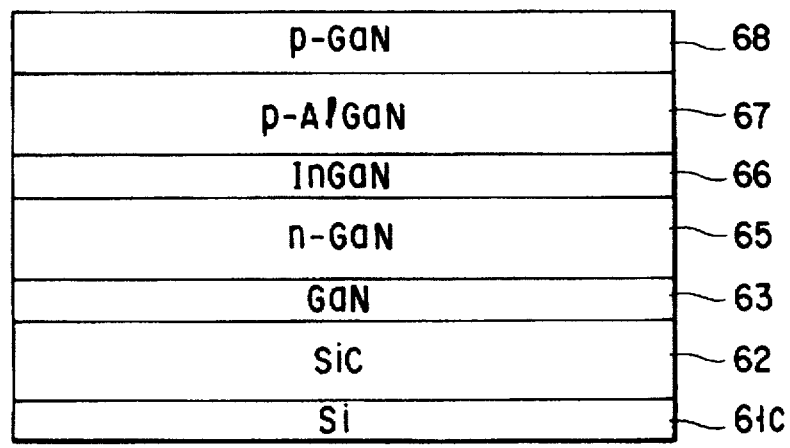

Specifically, FIGS. 6A to 6C are cross sectional views collectively showing the process of manufacturing a semiconductor light-emitting element according to a second embodiment of the present invention. In the first step, an n-type (111) silicon single crystal wafer 61a having a diameter of 4 inches was put in a high vacuum chemical vapor deposition apparatus. Then, TMA which was subjected to bubbling by using a nitrogen gas was allowed to flow into the apparatus at 1,000° C. for 30 minutes together with a N$_2$O gas under a pressure of $4 \times 10^{-1}$ Torr so as to form an Al-containing oxide layer 61b having a thickness of about 60 nm, followed by allowing a disilane gas to flow into the apparatus at 950° C. for 10 minutes so as to form a silicon layer 61c having a thickness of about 400 nm, as shown in FIG. 6A.

The resultant SOI substrate 61 thus prepared was put in the metal-organic chemical vapor deposition apparatus as shown in FIG. 4, followed by forming a laminate structure of gallium nitride-based semiconductor layers, as follows. In the first step, an electric power was supplied to the radio frequency heating device 45 while supplying a hydrogen gas into the vapor growth vessel 41 through the gas inlet port 42 so as to control the temperature within the vapor growth vessel 41 at 1,400° C. Then, an acetylene gas was supplied together with a nitrogen gas into the vapor growth vessel 41 so as to carbonize the surface region of the silicon layer 61c so as to form a nitrogen-added SiC layer 62 having a thickness of 300 nm. After formation of the SiC layer 62, the acetylene gas ceased to be supplied and, at the same time, supply of an ammonia gas into the vapor growth vessel 41 was started, followed by lowering the temperature within the vapor growth vessel to 600° C. When the temperature was stabilized at 600° C., supply of TMG was started so as to achieve a GaN growth for 6 minutes, thereby to form a GaN layer (buffer layer) 63 having a thickness of 20 nm. Then, the TMG supply was stopped, followed by elevating again the temperature within the vapor growth vessel 41 to 1,200° C.

In the next step, supply of a silane gas diluted with a hydrogen gas into the vapor growth vessel 41 was started together with supply of a TMG gas so as to achieve growth of a silicon-added n-type GaN layer 65 for 30 minutes. After formation of the layer 65, both TMG and silane ceased to be supplied, followed by lowering the temperature within the vapor growth vessel 41 to 900° C. When the temperature was stabilized at 900° C., both TMG and TMI were supplied into the vapor growth vessel 41 so as to achieve growth of an InGaN layer 66 for one minute. After formation of the InGaN layer 66, the temperature within the vapor growth vessel 41 was elevated again to 1,200° C. When the temperature was stabilized at 1,200° C., TMG, TMA and Cp$_2$Mg were supplied into the vapor growth vessel 41 so as to achieve growth of a Mg-added p-type AlGaN layer 67 for 15 minutes, followed by stopping the supply of TMA so as to continue the growth of a Mg-added p-type GaN layer 68 for 10 minutes.

After formation of the layer 68, both TMG and Cp$_2$Mg ceased to be supplied, and the power supply to the radio frequency heating device 45 was stopped. When the temperature within the vapor growth vessel 41 was lowered to 350° C., the ammonia supply was also stopped. A cross section of the resultant wafer thus prepared was observed with an electron microscope, with the result that the thickness of the laminate structure portion consisting of the gallium nitride-based semiconductor layers was found to be 2.7 μm, which was markedly thicker than the thickness (300 nm) of the SiC layer 62 formed on the silicon layer 61c present on the uppermost surface of the substrate 61. It has also been found that the thickness of the buffer layer 63 was 20 nm. In other words, it has been confirmed that the thickness (300 nm) of the SiC layer 62 was more than twice the thickness of the buffer layer 63.

Then, the resultant wafer was dipped in a mixed solution consisting of hydrofluoric acid and nitric acid so as to dissolve the silicon layer interposed between the oxide layer and the SiC layer so as to remove completely the Al-added oxide layer 61b together with the substrate. Further, the laminate structure of the gallium nitride-base material layers was taken out carefully, followed by washing the laminate structure with a flowing water and subsequently drying the laminate structure. Still further, a laminate structure of Ni/Ti/W was formed by using a sputtering apparatus on the back surface, i.e., the surface of the SiC layer 62, of the laminate structure consisting of the gallium nitride-based material layers, followed by applying a heat treatment at 1,000° C. for 30 minutes so as to obtain an electrode exhibiting ohmic characteristics. Finally, a laminate structure of Ni/Au was formed by vapor deposition on the front surface of the laminate structure of the gallium nitride-base material layers, followed by applying a heat treatment at 800° C. for 25 seconds so as to obtain an electrode exhibiting ohmic characteristics.

A cross section of the semiconductor light-emitting diode thus prepared was observed with an electron microscope, with the result that cracks, which are observed in some cases in the conventional light-emitting diode, were not observed at all. Also, stripe-like defects, which are observed on a bundle of dislocations in the conventional light-emitting diode, were not observed at all. Further, the optical properties of the resultant light-emitting diode were measured, with the result that the light-emitting efficiency of the diode was very high. Specifically, the peak of the wavelength of the light emitted from the light-emitting diode was 520 nm. Further, under the condition that current of 20 mA was conducted through the diode, the operating voltage of the diode was as low as 2.0V, and the external quantum efficiency was as high as 13.4%.

The light-emitting diode was subjected to a life test under a current of 40 mA. The defect occurrence after the test, which was continued for 1,000 hours, was found to be 1% or less, supporting that the present invention permits prolonging the life of the light-emitting diode.

An additional experiment was conducted similarly. In this experiment, a substrate prepared by forming a thin silicon layer on the surface of a sapphire substrate was used in place of the SOI substrate 61 used in Example 2, with satisfactory results fully comparable with those of Example 2. Further, a silicon carbide layer was formed in direct contact with a silicon substrate in another experiment. In other words, an oxide layer and/or nitride layer was not interposed between the silicon substrate and the silicon carbide layer. It has been found that, if the silicon substrate is removed in the subsequent step by means of polishing, it is possible to obtain a light-emitting diode exhibiting satisfactory light-emitting properties, though it is made difficult to control the thickness of the substrate.

EXAMPLE 3

This Example is intended to study the impurity addition to the silicon carbide layer.

Figure 7A:
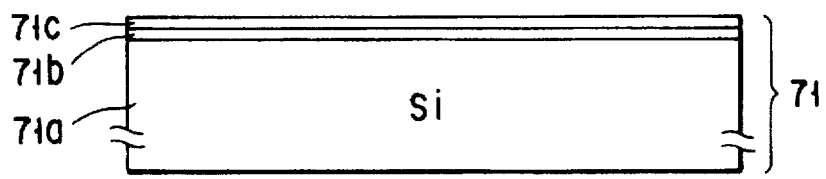
FIGS. 7A to 7C are cross sectional views collectively showing the process of manufacturing a light-emitting diode according to a third embodiment of the present invention.
Figure 7B:
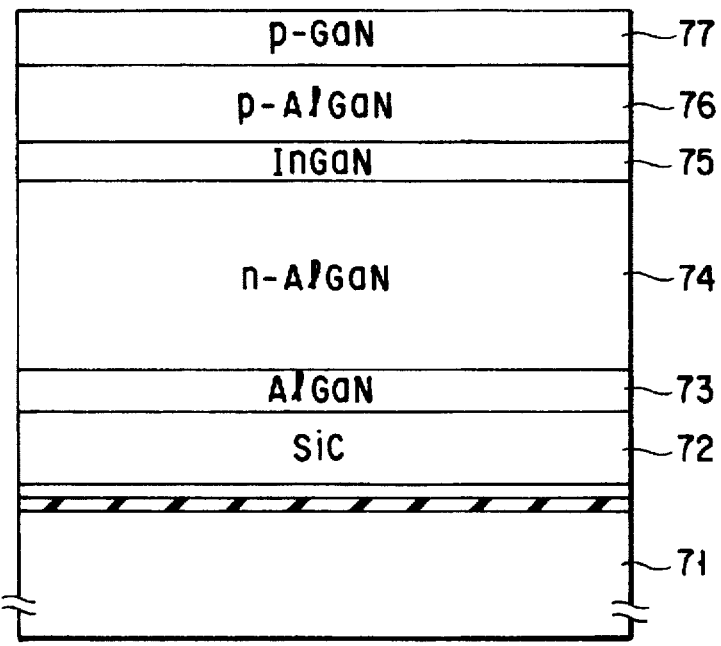
Figure 7C:
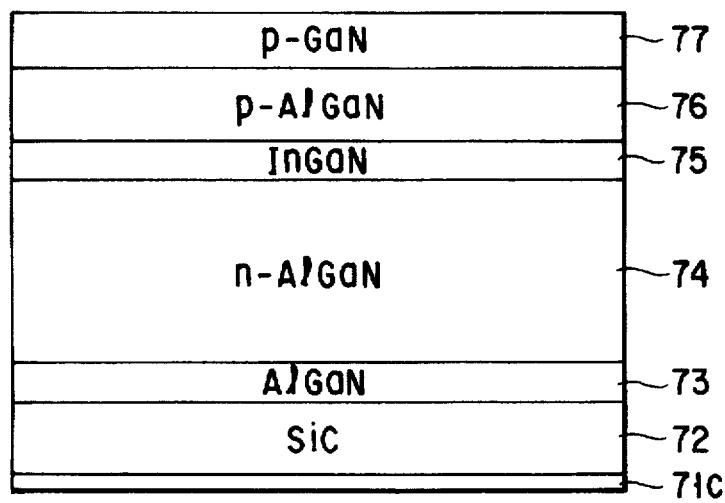

Specifically, FIGS. 7A to 7C are cross sectional views collectively showing the process of manufacturing a light-emitting diode according to a third embodiment of the present invention. In the first step, oxygen ions were implanted into a p-type (111) silicon single crystal wafer having a diameter of 4 inches at a dose of $4 \times 10^{17}$ atoms/cm$^2$. The ion implantation was performed under an accelerating energy of 180 keV and a beam current of 70 mA. Also, the substrate temperature was maintained at 550° C. during the ion implantation step. After the ion implantation, the wafer was subjected to a heat treatment at 1,350° C. for 3 hours under a mixed gas atmosphere consisting of an argon gas and an oxygen gas so as to form a homogeneous buried oxide layer 71b having a thickness of 82 nm below the uppermost silicon single crystal layer 71c having a thickness of about 330 nm. A reference numeral 71a shown in the drawings denotes a silicon substrate. The resultant SIMOX wafer was used as a substrate 71 including the silicon substrate 71a, buried oxide layer 71b and silicon single crystal layer 71c, as shown in FIG. 7A. An X-ray diffractometry was applied separately to the substrate 71. It has been found that the planar direction of the uppermost silicon single crystal layer 71c was (111).

The resultant substrate 71 thus prepared was put in the metal-organic chemical vapor deposition apparatus as shown in FIG. 4, followed by forming a laminate structure of gallium nitride-based semiconductor layers, as follows. In the first step, an electric power was supplied to the radio frequency heating device 45 while supplying a nitrogen gas into the vapor growth vessel 41 through the gas inlet port 42 so as to control the temperature within the vapor growth vessel 41 at 1,400° C. Then, an acetylene gas, a disilane gas and a germane gas were supplied into the vapor growth vessel 41 so as to form a germanium-added SiC layer 72 on the surface of the silicon layer 71c. In this step, the germane gas supply rate was linearly increased with time. A predetermined period of 7 minutes later, the acetylene, silane and germane gases ceased to be supplied and, at the same time, the supply of an ammonia gas into the vapor growth vessel 41 was started, followed by lowering the temperature within the vapor growth vessel to 550° C. When the temperature was stabilized at 550° C., TMA was supplied so as to carry out growth of an AlN layer 73 for 2 minutes. Then, TMA ceased to be supplied, followed by elevating again the temperature within the vapor growth vessel 41 to 1,200° C.

In the next step, supply of a silane gas diluted with a hydrogen gas into the vapor growth vessel 41 was started together with a TMG gas and a TMA gas so as to achieve growth of a silicon-added n-type AlGaN layer 74 for 30 minutes. After formation of the layer 74, silane, TMG and TMA ceased to be supplied, followed by lowering the temperature within the vapor growth vessel 41 to 900° C. When the temperature was stabilized at 900° C., both TMG and TMI were supplied into the vapor growth vessel 41 so as to achieve growth of an InGaN layer 75 for 3 minutes. After formation of the InGaN layer 75, the temperature within the vapor growth vessel 41 was elevated again to 1,200° C. When the temperature was stabilized at 1,200° C., TMG, TMA and Cp$_2$Mg were supplied into the vapor growth vessel 41 so as to achieve growth of a Mg-added p-type AlGaN layer 76 for 15 minutes, followed by stopping the supply of TMA so as to continue the growth of a Mg-added p-type GaN layer 77 for 5 minutes.

After formation of the layer 77, both TMG and Cp$_2$Mg ceased to be supplied, and the power supply to the radio frequency heating device 45 was stopped. When the temperature within the vapor growth vessel 41 was lowered to 350° C., the ammonia gas supply was also stopped. The resultant wafer thus prepared was dipped in an aqueous solution of ammonium fluoride. Under this condition, an ultrasonic vibration was imparted to the wafer so as to dissolve gradually the buried oxide layer 71b. As a result, the underneath silicon single crystal layer 71a was peeled completely off the laminate structure of the gallium nitride-based material layers in about 2 hours. The laminate structure of the gallium nitride-based material layers was taken out carefully, followed by washing the laminate structure with a flowing water and subsequently drying the laminate structure. Then, a laminate structure of Ni/Ti/W was formed by using a sputtering apparatus on the back surface, i.e., the surface of the SiC layer 72, of the laminate structure of the gallium nitride-based material layers. A very thin oxide layer was found to have remained partly on the surface of the SiC layer 72. However, the residual oxide layer was considered not to bring about any practical problem. In addition, a very long time would be required for removing completely the oxide layer remaining on the SiC layer 72. Under the circumstances, the residual oxide layer was left unremoved. Then, a Au—Zn alloy layer was formed by vapor deposition on the front surface of the Mg-added GaN layer 77, followed by applying a heat treatment at 800° C. for 2 minutes, with the result that each of the Ni/Ti/W laminate structure and the Au—Zn alloy layer exhibited ohmic electrode characteristics.

A cross section of the semiconductor light-emitting element thus prepared was observed with an electron microscope, with the result that cracks, which are observed in some cases in the conventional diode, were not observed at all. Also, stripe-like defects, which are observed on a bundle of dislocations in the conventional diode, were not observed at all. Further, the optical properties of the resultant light-emitting diode were measured, with the result that the light-emitting efficiency of the diode was very high. Specifically, the peak of the wavelength of the light emitted from the light-emitting diode was 520 nm. Further, under the condition that current of 20 mA was conducted through the device, the operating voltage of the device was as low as 2.1V, and the external quantum efficiency was as high as 12.2%.

The light-emitting diode was subjected to a life test under a current of 40 mA. The defect occurrence after the test, which was continued for 1,000 hours, was found to be 1% or less, supporting that the present invention permits prolonging the life of the light-emitting diode.

In order to confirm the effectiveness of the method employed in Example 3 described above, an AlGaN layer, which was not doped with any impurity, was grown on the Ge-added SiC layer, as in the process of forming the Si-added AlGaN layer 74 employed in Example 3, followed by cooling the wafer. Then, the AlGaN layer was treated with a hot phosphoric acid so as to count the number of etch pits appearing on the surface within a visual field of 333 μm×256 μm. The number of etch pits was found to be 3 to 4 on the average. This indicates that the dislocation density calculated on the basis of the area of the visual field is as low as 3.5 to 4.7×10$^3$ etch pits/cm$^2$, supporting that the AlGaN layer thus formed consists of a high quality crystal. Incidentally, it is desirable to take a large visual field in order to determine accurately the dislocation density.

Figure 8:
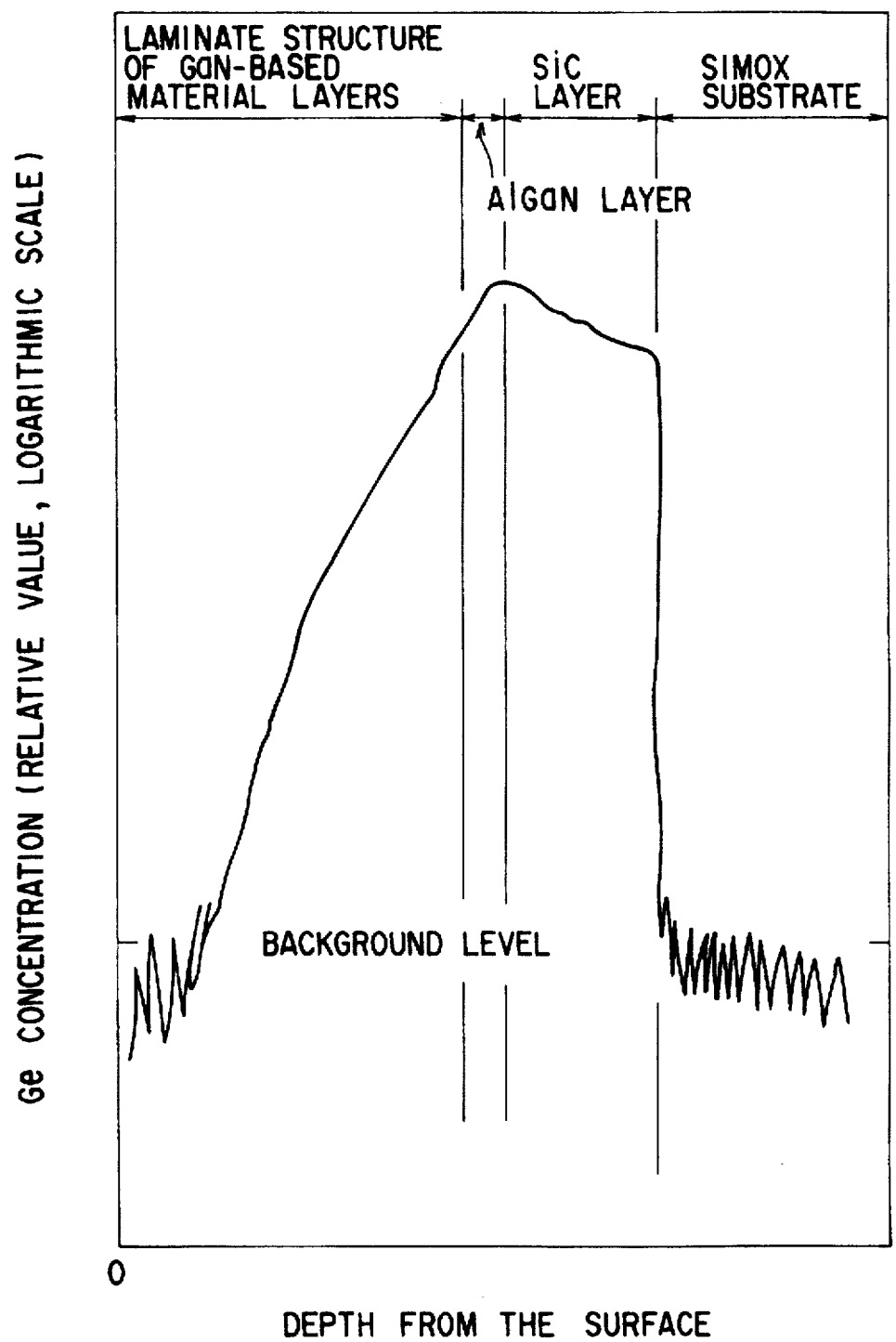
FIG. 8 is a graph showing the distribution of the germanium concentration in the depth direction of the light-emitting diode according to the third embodiment of the present invention.

Then, the germanium concentration of the same sample was measured by means of the secondary ion mass spectrometry. The analysis was performed in a depth direction starting with the uppermost surface of the laminate structure of the gallium nitride-based material layers. Since the thickness of each layer included in the wafer was already measured separately by an electron microscope, the depth from the uppermost surface corresponds to the position of each layer, as apparent from FIG. 8. As already described in conjunction with the manufacturing process, a germane gas was supplied only during the growing process of the silicon carbide layer. However, germanium was found to have been contained in the AlGaN layer 74, too, as apparent from FIG. 8. The presence of germanium within the AlGaN layer, particularly, in the vicinity of the boundary between the AlGaN layer and the SiC layer is considered to produce the effect of making the lattice mismatching at the boundary smaller than designed, or the effect of making the change in the lattice constant moderate so as to suppress the stress concentration on the boundary between the AlGaN layer and the SiC layer. As a result, it is possible to obtain a gallium nitride-base material layer having a very low dislocation density.

A SIMOX substrate doped with a low dose of an impurity was used in this embodiment. Alternatively, it is also possible to use a substrate available on the market, said substrate including a buried oxide layer having a thickness of 400 nm and an uppermost silicon layer having a thickness of 100 nm, with substantially the same effect.

EXAMPLE 4

This Example is intended to study the addition of another impurity to the silicon carbide layer.

Figure 9:
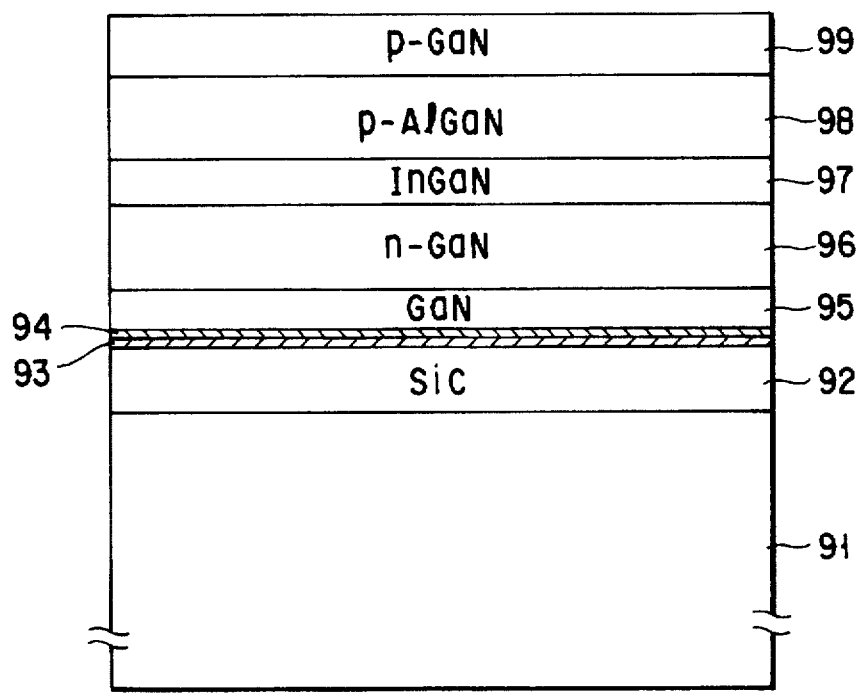
FIG. 9 is a cross sectional view showing the construction of a light-emitting diode according to a fourth embodiment of the present invention.

Specifically, FIG. 9 is a cross sectional view showing the process of manufacturing a light-emitting diode according to a fourth embodiment of the present invention. A substrate 91 shown in FIG. 9 is a SIMOX substrate available on the market, said substrate having a diameter of 4 inches and including an oxide layer having a thickness of 400 nm and an uppermost silicon layer having a thickness of 100 nm.

In the first step, the substrate 91 was put in the metal-organic chemical vapor deposition apparatus shown in FIG. 4. Then, a laminate structure of gallium nitride-based material layers was prepared as follows. Specifically, an electric power was supplied to the radio frequency heating device 45, while supplying a hydrogen gas through the gas inlet port 42 into the vapor growth vessel 41, so as to control the temperature within the vapor growth vessel 41 at 1,400° C. Then, supply of an acetylene gas and a disilane gas into the vapor growth vessel 41 was started together with supply of an ammonia gas so as to form a nitrogen-added SiC layer 92 on the surface of the substrate 91. After formation of the SiC layer 92, the supply of the acetylene gas and the disilane gas was stopped, and the temperature within the vapor growth vessel 41 was lowered to 1,000° C. Then, titanium was evaporated by a filament heating so as to form a thin titanium layer 93 on the SiC layer 92, followed by performing the titanium diffusion at 1,000° C. for 30 minutes. Further, tin was evaporated by a filament heating so as to form a thin tin film 94 on the titanium film 93.

In the next step, the temperature within the vapor growth vessel 41 was lowered to 600° C. When the temperature was stabilized at 600° C., both TMG and ammonia were supplied into the vapor growth vessel so as to achieve growth of a gallium nitride layer 95 for 5 minutes. Then, supply of TMG was stopped, followed by elevating again the temperature within the vapor growth vessel 41 to 1,200° C. Under this condition, supply of a silane gas diluted with hydrogen and TMG was started so as to achieve growth of a silicon-added gallium nitride layer 96 for 30 minutes. Then, the supply of TMG and silane was stopped, followed by lowering the temperature within the vapor growth vessel 41 to 900° C. When the temperature was stabilized at 900° C., both TMG and TMI were supplied so as to achieve growth of an InGaN layer 97 for 3 minutes. After growth of the layer 97, the supply of TMG and TMI was stopped, followed by elevating again the temperature within the vapor growth vessel 41 to 1,200° C. When the temperature was stabilized at 1,200° C., TMG, TMA and Cp$_2$Mg were supplied into the vapor growth vessel 41 so as to achieve growth of a Mg-added AlGaN layer 97 for 15 minutes, followed by stopping the TMA supply so as to continue to achieve the growth of a Mg-added gallium nitride layer 99 for 10 minutes. Then, both TMG and Cp$_2$Mg ceased to be supplied. Further, the power supply to the radio frequency heating device 45 was also stopped. When the temperature within the vapor growth vessel 41 was lowered to 350° C., the ammonia gas ceased to be supplied.

A cross section of the wafer thus prepared was observed with an electron microscope. In the conventional wafer which does not include the thin titanium and tin layers interposed between the SiC layer and the laminate structure of the gallium nitride-based material layers, a clear boundary is observed between the gallium nitride layer and the SiC layer. In the element shown in FIG. 9, however, a change in the contrast was not recognized at all.

Then, the distribution in a direction of the depth of the wafer starting with the wafer surface was measured by the secondary ion mass spectrometry in respect of the concentration of each of titanium and tin contained in the sample. FIG. 10 shows the result. The positions of the layers of the wafer in the depth direction were estimated on the basis of an electron micrograph showing a cross section of a conventional wafer which did not include the thin interposed layers of titanium and tin, said conventional wafer being prepared separately.

As apparent from FIG. 10, both titanium and tin were diffused such that a large amount of titanium was contained in the SiC layer 92 and a large amount of tin was contained in the gallium nitride layer 95. As a result, the lattice constant of the silicon carbide layer 92 is increased, with the lattice constant of the gallium nitride layer 95 being decreased. It may be reasonable to interpret that the difference in lattice constant between the silicon carbide layer 92 and the gallium nitride layer 95 was diminished to substantially zero, leading to the result that the contrast was so low in the observation with an electron microscope that the boundary between these two layers was not recognized, as already pointed out.

It has been found that the dislocation density (etch pit density) determined by the treatment with a hot phosphoric acid was 3.5 to 4.7×10$^3$ etch pits/cm$^2$, supporting that the gallium nitride layer 95 was formed of a high quality crystal having a very low dislocation density. The wafer was dipped in a mixed solution consisting of a hydrofluoric acid and nitric acid so as to dissolve the uppermost silicon layer of the substrate 91 interposed between the oxide layer included in the substrate 91 and the silicon carbide layer 92 so as to remove completely the aluminum-containing oxide layer together with the substrate 91.

Then, the laminate structure of the gallium nitride-based material layers was taken out carefully, followed by washing the laminate structure with a flowing water and subsequently drying the laminate structure. Further, a laminate structure of Ni/Ti/W was formed by using a sputtering apparatus on the back surface, i.e., the lower surface of the silicon carbide layer 92, of the laminate structure of the gallium nitride-based material layers. Then, the laminate structure of Ni/Ti/W was subjected to a heat treatment at 1,000° C. for 3 minutes so as to obtain ohmic electrode characteristics. Further, a laminate structure of Ni/Au was formed by vapor deposition on the front surface, i.e., the upper surface of the Mg-added gallium nitride layer 99, of the laminate structure of the gallium nitride-based material layers. Then, the laminate structure of Ni/Au was subjected to a heat treatment at 800° C. for 3 minutes so as to obtain ohmic electrode characteristics.

A cross section of the light-emitting diode thus prepared was observed with an electron microscope, with the result that cracks, which are observed in some cases in the conventional diode, were not observed at all. Also, sinuous defects, which are observed in the conventional diode in the shape of a bundle of dislocations, were not observed at all. Further, the optical properties of the resultant light-emitting diode were measured, with the result that the light-emitting efficiency of the diode was very high. Specifically, the peak of the wavelength of the light emitted from the light-emitting diode was 520 nm. Further, under the condition that current of 20 mA was conducted through the diode, the operating voltage of the diode was as low as 2.0V, and the external quantum efficiency was as high as 13.4%.

The light-emitting diode was subjected to a life test under a current of 40 mA. The defect occurrence after the test, which was continued for 1,000 hours, was found to be 1% or less, supporting that the present invention permits prolonging the life of the light-emitting diode.

EXAMPLE 5

A semiconductor laser was prepared by using the chemical vapor deposition apparatus constructed as shown in FIG.

Figure 11A:
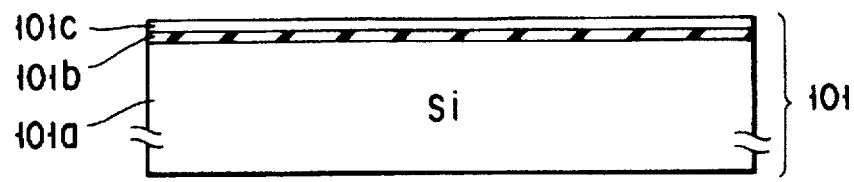
FIGS. 11A to 11C are cross sectional views collectively showing the process of manufacturing a semiconductor laser according to a fifth embodiment of the present invention.
Figure 11B:
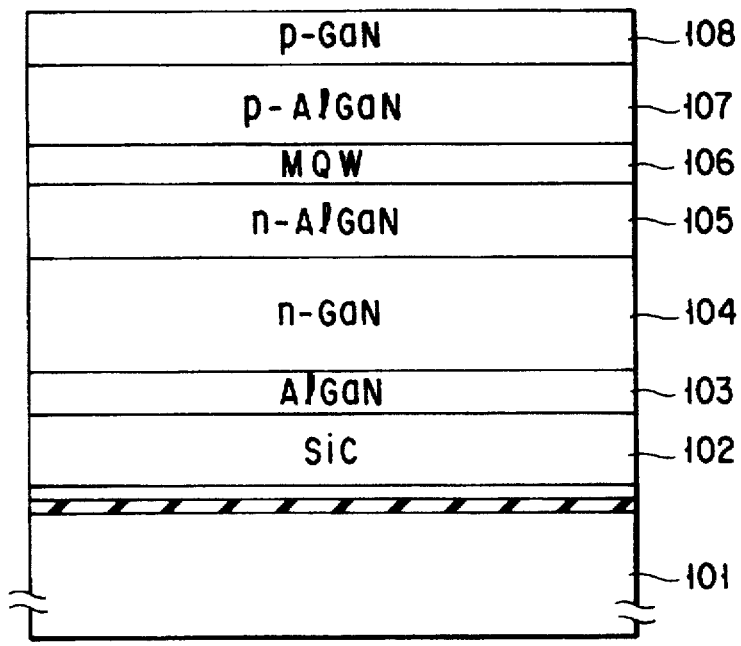
Figure 11C:
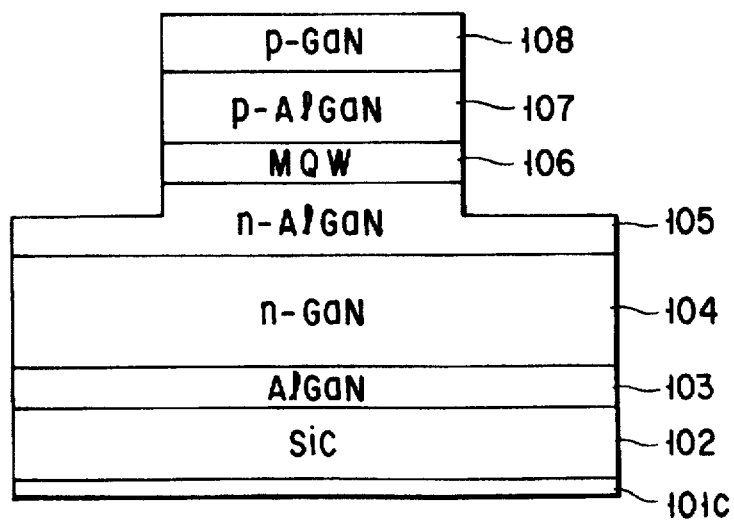

4. FIGS. 11A to 11C are cross sectional views collectively showing the manufacturing process of the semiconductor laser.

Specifically, before carrying out a crystal growth, oxygen ions were implanted at a dose of $4 \times 10^{17}$ atoms/cm$^2$ into an n-type (111) silicon single crystal wafer having a diameter of 4 inches. The ion implantation was performed under an accelerating energy of 180 keV and a beam current of 70 mA. During the ion implantation step, the substrate temperature was maintained at 550° C. The wafer after the ion implantation step was subjected to a heat treatment at 1350° C. for 3 hours under a mixed gas atmosphere consisting of an argon gas and an oxygen gas so as to form a homogeneous oxide layer 101b having a thickness of 82 nm below the uppermost silicon single crystal layer 101c having a thickness of about 330 nm. Incidentally, a reference numeral 101a denotes the underneath silicon substrate. The resultant SIMOX wafer thus prepared, which is shown in FIG. 11A, was used as a substrate 101.

In the next step, supply of an electric power to the radio frequency heating device 45 was started, while supplying a hydrogen gas into the vapor growth vessel 41, so as to control the indication of the thermocouple 46 at 1,400° C. Incidentally, the indication of the thermocouple 46 is simply referred to hereinafter as temperature. Then, supply of an acetylene gas and a nitrogen gas was started so as to carbonize the surface of the SIMOX substrate 101 and to form a nitrogen-added silicon carbide layer 102 having a thickness of 300 nm, followed by stopping the acetylene gas supply and, at the same time, starting an ammonia gas supply into the vapor growth vessel 41. Further, the temperature within the vapor growth vessel 41 was lowered to 600° C. When the temperature was stabilized at 600° C., both TMG and TMA were supplied into the vapor growth vessel 41 so as to achieve growth of AlGaN for 5 minutes and, thus, to form an AlGaN layer (buffer layer) 103 having a thickness of 20 nm. Then, supply of TMG and TMA was stopped, followed by elevating again the temperature within the vapor growth vessel 41 to 1,200° C.

In the next step, supply of both a silane gas diluted with a hydrogen gas and a TMG gas was started so as to achieve growth of a silicon-added n-type GaN layer 104 for 30 minutes, followed by adding a TMA gas so as to achieve growth of a silicon-added n-type AlGaN layer 105 for 15 minutes.

After stopping the supply of TMG, TMA and silane into the vapor growth vessel 41, the temperature within the vapor growth vessel 41 was lowered to 900° C. When the temperature was stabilized at 900° C., TMG and TMI were supplied at flow rates of 13 μmol/min and 17 μmol/min, respectively, for 90 seconds into the vapor growth vessel 41 so as to achieve growth of an $In_{0.05}Ga_{0.95}N$ layer having a thickness of 5 nm as a barrier layer, followed by supplying TMG and TMI at flow rates of 13 μmol/min and 146 μmol/min, respectively, for 45 minutes so as to form an $In_{0.15}Ga_{0.85}N$ layer having a thickness of 2.5 nm as a well layer. These operations were repeated to form an $In_{0.05}Ga_{0.95}N$ layer and an $In_{0.15}Ga_{0.85}N$ layer alternately so as to form an MQW (Multi-Quantum Well) structure 106 including 15 pairs each consisting of a barrier layer and a well layer.

In the next step, the supply of TMG and TMI was stopped, followed by elevating again the temperature within the vapor growth vessel 41 to 1,200° C. When the temperature was stabilized at 1,200° C., TMG, TMA and Cp$_2$Mg were supplied into the vapor growth vessel 41 to achieve growth of a Mg-added p-type AlGaN layer 107 for 15 minutes, followed by stopping the supply of TMA so as to continue to achieve growth of a Mg-added p-type GaN layer 108 for 10 minutes, as shown in FIG. 11B.

Then, the supply of TMG and Cp$_2$Mg was stopped. Further, the power supply to the radio frequency heating device 45 was also stopped. When the temperature within the vapor growth vessel 41 was lowered to 350° C., the supply of the ammonia gas was also stopped. The thickness of the laminate structure portion consisting of the gallium nitride-based material layers 103 to 108 included in the resultant wafer was measured by an electron microscope, with the result that the thickness thus measured was 3.7 μm, finding that the thickness thus measured was markedly larger than the thickness (300 nm) of the silicon carbide layer 103 formed on the uppermost surface of the substrate 101. Further, the thickness of the silicon carbide layer 102, which was 300 nm as noted above, was more than twice the thickness of the buffer layer 103, which was 20 nm.

The resultant wafer thus obtained was dipped in an aqueous solution of ammonium fluoride. Under this condition, an ultrasonic vibration was imparted to the wafer so as to gradually dissolve the buried oxide (BOX: Buried OXide) layer 51b included in the SIMOX substrate. As a result, the underneath silicon single crystal substrate was completely separated from the laminate structure of the gallium nitride-based material layers in about 2 hours.

In the next step, the peripheral portion of the laminate structure was removed by etching to reach the central region in the depth direction of the n-type AlGaN layer 105 so as to leave the central portion alone of the laminate structure unremoved. As a result, a current narrowing structure was obtained as shown in FIG. 11C.

Then, a laminate structure of Ni/Cr/W was formed by using a sputtering apparatus on the back surface, i.e., the lower surface of the silicon carbide layer 52 (the lower surface of the residual silicon single crystal layer 51c), of the laminate structure of the gallium nitride-base material layers. A very thin oxide layer was left partly unremoved on the back surface of the laminate structure of the gallium nitride-based material layers. However, it would clearly take a long time to remove completely the residual oxide layer. In addition, the residual oxide layer was considered not to bring about a practical problem. Under the circumstances, the residual oxide layer was left unremoved. The laminate structure of Ni/Cr/W was subjected to a heat treatment at 1,000° C. for 20 minutes so as to obtain ohmic electrode characteristics. Then, a Au—Zn alloy layer was formed by vapor deposition on the front surface of the laminate structure of the gallium nitride-based material layers. The Au—Zn alloy layer thus formed was subjected to a heat treatment at 800° C. for 2 minutes so as to obtain ohmic electrode characteristics.

A cross section of the semiconductor laser thus prepared was observed with an electron microscope, with the result that cracks, which are observed in some cases in the conventional semiconductor element, were not observed at all. Also, stripe-like defects, which are observed on a bundle of dislocations in the conventional semiconductor laser, were not observed at all. Further, the laser characteristics of the resultant semiconductor laser were measured, with the result that the semiconductor laser continuously operated at a room temperature, and had a lifetime of 100 hours or more.

A SIMOX substrate doped with a low dose of an impurity was used in this embodiment. Alternatively, it is also possible to use a substrate available on the market, said substrate including a buried oxide layer having a thickness of 400 nm and an uppermost silicon layer having a thickness of 100 nm, with substantially the same effect. Also, in this embodiment, a heat treatment was applied after the ion implantation step at 1,350° C. for 3 hours under a mixed gas atmosphere consisting of an argon gas and an oxygen gas in the step of preparing the SIMOX substrate so as to convert the uppermost silicon layer into a silicon single crystal layer. However, even if the particular heat treatment is omitted, it is possible to obtain substantially the same effect.

However, since the life of the semiconductor laser was found to tend to be shortened to some extent, a measure against the difficulty was taken. Specifically, nitric acid and hydrofluoric acid were added in the step of dissolving the buried oxide layer. It has been found that, if the very small amount of the residual silicon is removed in this fashion together with the oxide layer, the ohmic properties of the electrode are not impaired over a long period of time, leading to a long life of the semiconductor laser.

As described above, the silicon carbide layer 102 is interposed in this embodiment between the SIMOX substrate 101 and the laminate structure of the gallium nitride-based material layers 102 to 108, making it possible to achieve the crystal growth of the laminate structure portion under the condition that the lattice mismatching is made markedly small. Then, the oxide layer 101b included in the SIMOX substrate 101 is also removed in the subsequent step, making it possible to alleviate the lattice strain received by the gallium nitride-based material layers under the influence given by the underneath substrate, though the lattice strain noted above is small. It follows that, during the heat treatment included in the subsequent process of preparing the semiconductor laser, it is possible to put the gallium nitride-based material layers under the condition that these gallium nitride-based material layers do not receive at all the stress derived from the lattice mismatching with the underneath substrate or the difference in the thermal expansion coefficient from the underneath substrate. As a result, it was possible to suppress proliferation of dislocations and occurrence of fine cracks which cannot be detected by naked eyes, making it is possible to obtain a semiconductor laser exhibiting excellent laser characteristics.

In Example 5, a current narrowing structure was prepared by etching the peripheral portion of the laminate structure of the gallium nitride-based material layers. However, the current narrowing structure can be formed by other methods. For example, it is possible to prepare the current narrowing structure by means of ion implantation of an i-type impurity such as protons or an n-type impurity such as silicon into the region which is to be removed by etching, said region being apparent from FIG. 11C, so as to form a current blocking region.

EXAMPLE 6

This Example is intended to study the use of another substrate.

Figure 12A:
FIGS. 12A to 12C are cross sectional views collectively showing the process of manufacturing a semiconductor laser according to a sixth embodiment of the present invention.
Figure 12B:
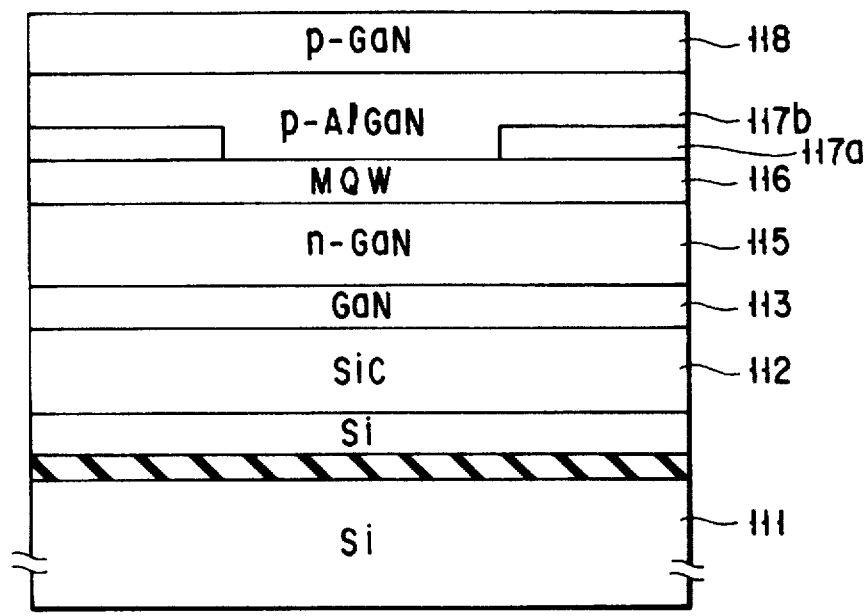
Figure 12C:
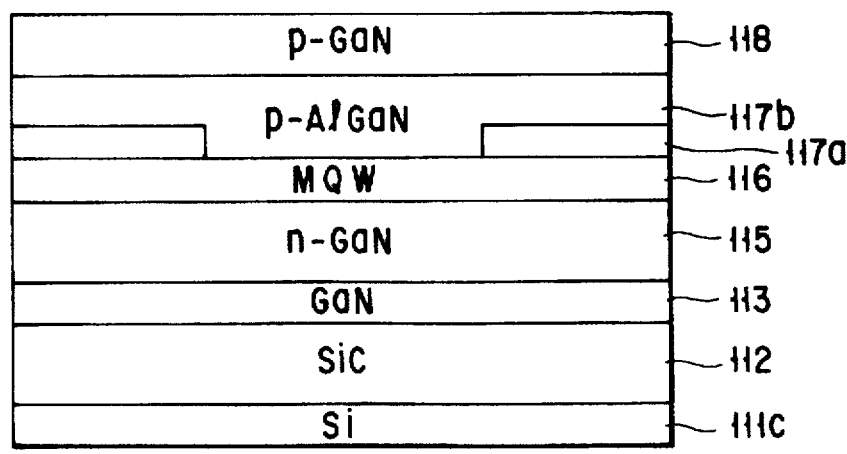

Specifically, FIGS. 12A to 12C are cross sectional views collectively showing the process of manufacturing a semiconductor laser according to a sixth embodiment of the present invention. In the first step, an n-type (111) silicon single crystal wafer 111a having a diameter of 4 inches was put in a high vacuum chemical vapor deposition apparatus. Then, an aluminum-containing oxide layer 111b having a thickness of about 60 nm was formed by allowing TMA, which was subjected to bubbling with a nitrogen gas at 1,000° C., and a $N_2O$ gas to flow simultaneously into the apparatus under a pressure of $4 \times 10^{-1}$ Pa, followed by forming a silicon layer 111c having a thickness of about 400 nm on the oxide layer 111b by allowing disilane to flow into the apparatus for 10 minutes at 950° C., as shown in FIG. 12A.

The resultant SOI substrate 111 thus prepared was put in an metal-organic chemical vapor deposition apparatus constructed as shown in FIG. 4 so as to prepare a laminate structure of gallium nitride-based material layers, as follows. In the first step, an electric power was supplied to the radio frequency heating device 45, while supplying a hydrogen gas into the vapor growth vessel 41 through the gas inlet port 42 so as to control the temperature within the vapor growth vessel 41 at 1,400° C. Then, both an acetylene gas and a nitrogen gas were supplied into the vapor growth vessel 41 so as to carbonize the surface region of the silicon layer 11c and, thus, to form a nitrogen-added silicon carbide layer 112 having a thickness of 300 nm. After formation of the silicon carbide layer 112, the acetylene gas supply was stopped and, at the same time, an ammonia gas was supplied into the vapor growth vessel 41, followed by lowering the temperature within the vapor growth vessel 41 to 600° C. When the temperature was stabilized at 600° C., TMG was supplied so as to achieve growth of GaN for 6 minutes, thereby to form a GaN layer (buffer layer) 113 having a thickness of 20 nm.

Then, the TMG supply was stopped, followed by elevating again the temperature within the vapor growth vessel 41 to 1,200° C., followed by starting supply of silane diluted with a hydrogen gas and TMG so as to achieve growth of a silicon-added n-type GaN layer 115 for 30 minutes.

After stopping the supply of TMG, TMA and silane into the vapor growth vessel 41, the temperature within the vapor growth vessel 41 was lowered to 900° C. When the temperature was stabilized at 900° C., TMG and TMI were supplied at flow rates of 13 μmol/min and 17 μmol/min, respectively, for 90 seconds into the vapor growth vessel 41 so as to achieve growth of an $In_{0.05}Ga_{0.95}N$ layer having a thickness of 5 nm as a barrier layer, followed by supplying TMG and TMI at flow rates of 19 μmol/min and 38 μmol/min, respectively, for 23 seconds so as to form an $In_{0.15}Ga_{0.85}N$ layer having a thickness of 2.5 nm as a well layer. These operations were repeated to form an $In_{0.05}Ga_{0.95}N$ layer and an $In_{0.15}Ga_{0.85}N$ layer alternately so as to form an MQW (Multi-Quantum Well) structure 116 including 15 pairs each consisting of a barrier layer and a well layer.

In the next step, the supply of TMG and TMI was stopped, followed by elevating again the temperature within the vapor growth vessel 41 to 1,200° C. When the temperature was stabilized at 1,200° C., a silane gas diluted with a hydrogen gas was supplied together with TMG into the vapor growth vessel 41 so as to achieve growth of a silicon-added n-type GaN layer 117a for 30 minutes. A central portion of the n-type GaN layer 117a was selectively removed so as to permit the peripheral portion alone to be left unremoved as a current blocking layer 117a.

Then, TMG, TMA and $Cp_2Mg$ were supplied into the vapor growth vessel 41 to achieve growth of a Mg-added p-type AlGaN layer 117b for 15 minutes, followed by stopping the supply of TMA so as to continue to achieve growth of a Mg-added p-type GaN layer 118 for 10 minutes.

Then, the supply of TMG and $Cp_2Mg$ was stopped. Further, the power supply to the radio frequency heating device 45 was also stopped. When the temperature within the vapor growth vessel 41 was lowered to 350° C., the supply of the ammonia gas was also stopped. The thickness of the laminate structure portion consisting of the gallium nitride-based material layers included in the resultant wafer was measured by an electron microscope, with the result that the thickness thus measured was 2.7 µm, finding that the thickness thus measured was markedly larger than the thickness (300 nm) of the silicon carbide layer 112 formed on the uppermost surface of the substrate 111. Further, the thickness of the silicon carbide layer 112, which was 300 nm as noted above, was more than twice the thickness of the buffer layer 113, which was 20 nm.

The resultant wafer thus obtained was dipped in a mixed solution consisting of hydrofluoric acid and nitric acid so as to remove completely the aluminum-containing oxide layer 111b together with the substrate, without dissolving the silicon layer interposed between the oxide layer and the silicon carbide layer.

Then, the laminate structure of the gallium nitride-based material layers was taken out carefully, followed by washing the laminate structure with a flowing water and subsequently drying the laminate structure. Further, a laminate structure of Ni/Cr/W was formed by using a sputtering apparatus on the back surface, i.e., the lower surface of the silicon carbide layer 112 of the laminate structure of the gallium nitride-base material layers. The laminate structure of Ni/Cr/W was subjected to a heat treatment at 1,000° C. for 30 minutes so as to obtain ohmic electrode characteristics. Then, a Ni/Au laminate structure was formed by vapor deposition on the front surface of the laminate structure of the gallium nitride-based material layers. The Ni/Au laminate structure thus formed was subjected to a heat treatment at 800° C. for 25 seconds so as to obtain ohmic electrode characteristics.

A cross section of the semiconductor laser thus prepared was observed with an electron microscope, with the result that cracks, which are observed in some cases in the conventional semiconductor element, were not observed at all. Also, stripe-like defects, which are observed on a bundle of dislocations in the conventional semiconductor laser, were not observed at all. Further, the laser characteristics of the resultant semiconductor laser were measured, with the result that the semiconductor laser continuously operated at a room temperature, and had a lifetime of 100 hours or more.

An additional experiment was conducted similarly. In this experiment, a substrate prepared by forming a thin silicon layer on the surface of a sapphire substrate was used in place of the SOI substrate 111 used in Example 6, with satisfactory results fully comparable with those of Example 6. Further, a silicon carbide layer was formed in direct contact with a silicon substrate in another experiment. In other an oxide layer and/or nitride layer was not interposed between the silicon substrate and the silicon carbide layer. It has been found that, if the silicon substrate is removed in the subsequent step by means of polishing, it is possible to obtain a light-emitting element exhibiting satisfactory light-emitting properties, though it is made difficult to control the thickness of the substrate.

Ohmic electrode materials are exemplified in any of Examples 1 to 6 described above. However, the technical idea of the present invention can be embodied in various other modified fashions, as far as the ohmic properties at least equal to those in these Example can be imparted by the electrode materials and the heat treating methods. It should be noted that, in forming a silicon carbide layer by carbonizing the silicon film, it is desirable not to carbonize the entire region of the silicon film such that the region adjacent to the insulating layer may be left to consist of silicon alone. If the carbonizing treatment is carried out for an unduly long time, the resultant carbon region which is rich in reactivity grows to reach the insulator layer included in the silicon substrate. Where the insulator is an oxide, the oxide is reduced, giving rise to generation of voids which are considered to be formed by carbon oxide. As a result, the surface of the silicon carbide layer positioned on the insulator layer tends to be roughened.

In the Examples described above, the substrate was removed chemically. However, similar effects can be obtained, even if the substrate is removed mechanically, e.g., by polishing. In employing the mechanical method, it is necessary to take measures for preventing an excessive stress from being applied to the laminate structure of the gallium nitride-based material layers.

In the above description of the present invention, an emphasis was placed on the removal of the substrate. However, it is also important to pay attentions to the treatment after the steps of forming a semiconductor light-emitting element region. It should be noted that the laminate structure portion consisting of the gallium nitride-based material layers is very thin after removal of the substrate, making it laborious to handle satisfactorily the laminate structure portion after the substrate removal. To overcome the difficulty, a mirror-finished silicon single crystal substrate 500 µm in thickness was bonded directly to the laminate structure in question to form an integral structure. The bonding of the laminate structure produces a prominent effect in protecting the element from the external force derived from the handling of the element in the subsequent steps such as the pelleting step by means of dicing, the mounting step of the resultant pellet to a lead frame, and the molding step. It follows that the particular bonding greatly contributes to an improvement of the yield.

The present invention is not limited to the Examples described above, and can be worked in various modified fashions. For example, the thickness of the silicon carbide layer can be determined appropriately, as far as the thickness is at least twice the thickness of the buffer layer and smaller than the thickness of the laminate structure portion consisting of the gallium nitride-based material layers. Further, where the substrate is partly left unremoved, the total thickness of the remaining substrate and the silicon carbide layer should fall within the range noted above. Still further, it is possible to use a thin film layer containing silicon carbide as a main component in place of the silicon carbide layer.

As described above, a silicon carbide-based thin film layer is interposed in the light-emitting element of the present invention between the substrate and the laminate structure of the gallium nitride-base material layers. It should be noted that the thickness of the particular silicon carbide-based thin film layer is made optimum. Further, the element to be added to the silicon carbide-based layer, as well as the amount and distribution of the additive element, is also made optimum. As a result, the state of a low stress can be maintained in preparing the laminate structure portion consisting of the gallium nitride-based material layers. In addition, the residual stress can be markedly lowered in the subsequent process of preparing a semiconductor light-emitting element. It follows that it is possible to suppress proliferation of dislocations and occurrence of fine cracks, making it possible to prevent the characteristics of the semiconductor element from being deteriorated. As a result, it is possible to improve the light-emitting efficiency, lower the operating voltage and prolong the life of the light-emitting element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor light-emitting device, comprising:

a substrate;

a buffer layer on the substrate comprising a gallium nitride-based material having a thickness less than half the thickness of the substrate; and a laminate structure on the buffer layer comprising a plurality of gallium nitride-based material layers, wherein said laminate structure comprises an active layer having a multi-quantum well structure comprising a plurality of pairs of layers comprising a barrier layer and a well layer, and the well layers have a carbon content higher than the barrier layers.

2. The semiconductor light-emitting device according to claim 1, wherein a IV group element is added to the substrate.

3. The semiconductor light-emitting device according to claim 2, wherein the IV group element is at least one element selected from the group consisting of Ge, Sn and Ti.

4. The semiconductor light-emitting device according to claim 2, wherein the concentration of the IV group element contained in the thin film falls within a range of between $10^{19}$ cm$^{-3}$ and $10^{23}$ cm$^{-3}$.

5. The semiconductor light-emitting device according to claim 2, wherein the concentration of the IV group element contained in the thin film is increased toward the buffer layer.

6. A light-emitting diode, comprising:

a substrate;

a buffer layer on the substrate comprising a gallium nitride-based material having a thickness less than half the thickness of the substrate; and a laminate structure on the buffer layer comprising a plurality of gallium nitride-based material layers, wherein said laminate structure comprises an active layer having a multi-quantum well structure comprising a plurality of pairs of layers comprising a barrier layer and a well layer, and the well layers have a carbon content higher than the barrier layers.

7. The light-emitting diode according to claim 2, wherein a IV group element is added to the substrate.

8. The light-emitting diode according to claim 7, wherein the IV group element is at least one element selected from the group consisting of Ge, Sn and Ti.

9. The light-emitting diode according to claim 7, wherein the concentration of the IV group element contained in the thin film falls within a range of between $10^{19}$ cm$^{-3}$ and $10^{23}$ cm$^{-3}$.

10. The light-emitting diode according to claim 7, wherein the concentration of the IV group element contained in the thin film is increased toward the buffer layer.

* * * * *